United States Patent
Kim

(10) Patent No.: US 9,607,709 B2
(45) Date of Patent: Mar. 28, 2017

(54) VOLTAGE GENERATOR, SEMICONDUCTOR MEMORY DEVICE HAVING THE SAME, AND METHOD OF OPERATING SEMICONDUCTOR MEMORY DEVICE

(71) Applicant: SK hynix Inc., Gyeonggi-do (KR)

(72) Inventor: Min Su Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/865,562

(22) Filed: Sep. 25, 2015

(65) Prior Publication Data

US 2016/0343447 A1 Nov. 24, 2016

(30) Foreign Application Priority Data

May 19, 2015 (KR) ........................ 10-2015-0069630

(51) Int. Cl.
G11C 16/30 (2006.01)
G05F 3/02 (2006.01)

(52) U.S. Cl.
CPC ................ *G11C 16/30* (2013.01); *G05F 3/02* (2013.01)

(58) Field of Classification Search
CPC ............ G11C 16/30; G11C 5/148; G05F 3/02
See application file for complete search history.

(56) References Cited

U.S. PATENT DOCUMENTS

| 6,363,031 | B2* | 3/2002 | Phelan ...................... 365/189.05 |
| 7,545,177 | B1* | 6/2009 | Kao .................... H03K 19/0016 |
| | | | 326/38 |
| 7,920,409 | B1* | 4/2011 | Clark .................... G11C 11/412 |
| | | | 365/154 |
| 8,816,754 | B1* | 8/2014 | Clark .................. H03K 17/145 |
| | | | 327/534 |

FOREIGN PATENT DOCUMENTS

KR 1020080004219 1/2008

* cited by examiner

*Primary Examiner* — Douglas King
(74) *Attorney, Agent, or Firm* — IP & T Group LLP

(57) ABSTRACT

A voltage generator that includes an operation mode determination circuit suitable for determining an active mode or a standby mode based on a chip enable signal to activate an active mode signal or a standby mode signal according to a result of the determination; and a bulk voltage generation circuit outputting a bulk voltage having an internal power voltage when the active mode signal is activated, and outputting the bulk voltage having an external power voltage when the standby mode signal is activated.

11 Claims, 5 Drawing Sheets

VOLTAGE GENERATOR, SEMICONDUCTOR MEMORY DEVICE HAVING THE SAME, AND METHOD OF OPERATING SEMICONDUCTOR MEMORY DEVICE

CROSS-REFERENCE TO RELATED APPLICATION

The present application claims priority to Korean patent application number 10-2015-0069630, filed on May 19, 2015, the entire disclosure of which is herein incorporated by reference in its entirety.

BACKGROUND

Field of Invention

Various embodiments relate to an electronic device, and more particularly, to a voltage generator, a semiconductor memory device having the same, and a method of operating the semiconductor memory device.

Description of Related Art

Semiconductor memory devices are typically categorized into volatile memory devices and non-volatile memory devices.

Volatile memory devices perform write and read operations at high speed, but they are unable to retain data stored therein without a constant source of power. Non-volatile memory devices perform write and read operations at relatively low speed, but they may retain their stored data regardless of whether they have a constant source of power. The non-volatile memory devices include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be NOR type or NAND type.

Flash memories have the advantages of both RAM and ROM. That is, flash memories may be freely programmed and erased similar to RAM. Similar to ROM, flash memories may retain stored data even without power. Flash memories have been widely used as the storage media of portable electronic devices such as mobile phones, digital cameras, personal digital assistants (PDAs), and MP3 players.

In semiconductor memory devices, to prevent a latch-up and unstable variations of threshold voltages of MOS transistors caused by the body effect, bulk voltages are to be applied to bulks of PMOS transistors and NMOS transistors within a semiconductor memory device.

Bulk voltages applied to the PMOS transistors and the NMOS transistors can the amount leakage current of PMOS and NMOS transistors that are in the off state, as well as the operating speed of the transistors. In other words, the amount of leakage current and the operating speed of the NMOS transistors may decrease when the bulk voltage is lower than its source terminal voltage. In addition, the amount of leakage current and the operating speed of the PMOS transistors may decrease with bulk voltages that are higher than the voltage of its source terminal.

SUMMARY

Various embodiments are directed to a voltage generator capable of reducing the amount of current consumed in a standby mode of a semiconductor memory device, a semiconductor memory device having the same, and a method of operating the semiconductor memory device.

According to an embodiment, a voltage generator may include an operation mode determination circuit suitable for determining an active mode or a standby mode based on a chip enable signal to activate an active mode signal or a standby mode signal according to a result of the determination; and a bulk voltage generation circuit outputting a bulk voltage having an internal power voltage when the active mode signal is activated, and outputting the bulk voltage having an external power voltage when the standby mode signal is activated.

According to an embodiment, a voltage generator generating an internal power voltage as a bulk voltage in an active mode of the semiconductor memory device and generating an external power voltage as the bulk voltage in a standby mode and an internal circuit including a plurality of transistors being applied with the bulk voltage.

According to an embodiment, a method of operating a semiconductor memory device may include outputting a standby mode signal when a chip enable signal is deactivated for a predetermined time or longer, switching an external power voltage to a bulk voltage in response to the standby mode signal, and applying the bulk voltage to a bulk of a transistor of an internal circuit to block leakage current.

DETAILED DESCRIPTION

Figure 1:
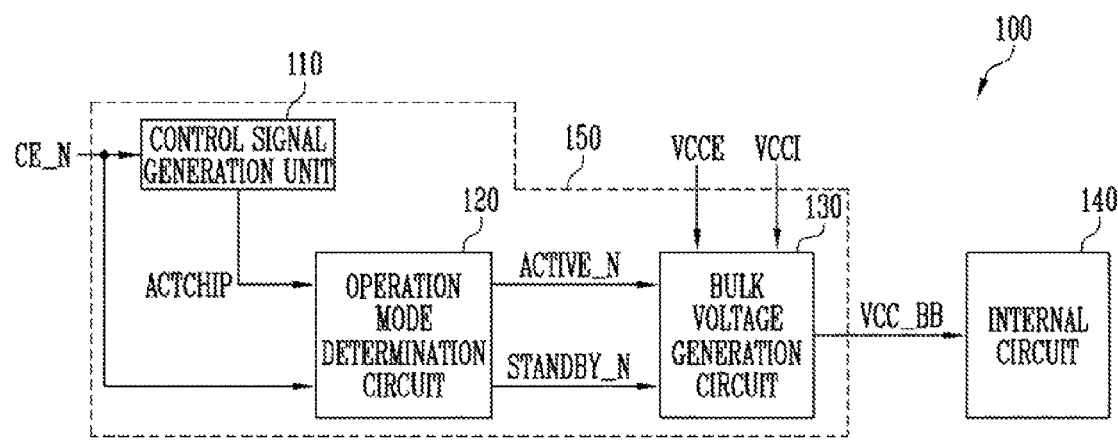
FIG. 1 is a block diagram illustrating a semiconductor memory device according to an embodiment of the present invention.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned. Furthermore, 'include/comprise' or 'including/comprising' used in the specification represents that one or more components, steps, operations, and elements exist or are added.

FIG. 1 is a block diagram illustrating a semiconductor memory device 100 according to an embodiment of the present invention.

Referring to FIG. 1, the semiconductor memory device 100 may include a voltage generator 150 and an internal circuit 140. The voltage generator may include a control signal generation unit 110, an operation mode determination circuit 120, and a bulk voltage generation circuit 130.

The control signal generation unit 110 may generate an active chip signal ACTCHIP in response to a chip enable signal CE_N for activating the semiconductor memory device 100. For example, the active chip signal ACTCHIP may transition from a logic high level to a logic low level when the chip enable signal CE_N is deactivated to a logic high level for a predetermined time. In addition, the semiconductor memory device 100 may determine a standby mode when the deactivation period of the chip enable signal CE_N reaches the predetermined time. For example, the semiconductor memory device 100 may determine the standby mode when the chip enable signal CE_N is deactivated to the logic high level for 10 μs.

The operation mode determination circuit 120 may generate an active mode signal ACTIVE_N and a standby mode signal STANDBY_N in response to the chip enable signal CE_N and the active chip signal ACTCHIP. The active mode signal ACTIVE_N and the standby mode signal STANDBY_N may have opposite logic levels. For example, when the active mode signal ACTIVE_N is in a logic low level, the standby mode signal STANDBY_N may be in a logic high level. On the other hand, when the active mode signal ACTIVE_N is in a logic high level, the standby mode signal STANDBY_N may be in a logic low level.

The bulk voltage generation circuit 130 may generate a bulk voltage VCC_BB by using an external power voltage VCCE and an internal power voltage VCCI in response to the active mode signal ACTIVE_N and the standby mode signal STANDBY_N, respectively. For example, the bulk voltage generation circuit 130 may generate the bulk voltage VCC_BB by using the internal power voltage VCCI in an active mode in which the active mode signal ACTIVE_N is activated to a logic low level, and the bulk voltage generation circuit 130 may generate the bulk voltage VCC_BB by using the external power voltage VCCE in a standby mode in which the standby mode signal STANDBY_N is activated to a logic low level. The external power voltage VCCE may be higher than the internal power voltage VCCI.

The internal circuit 140 may include a plurality of PMOS transistors and a plurality of NMOS transistors. The bulk voltage VCC_BB may be applied to bulks of the PMOS transistors. In addition, in the active mode, the bulk voltage VCC_BB generated using the internal power voltage VCCI may be applied to the internal circuit 140, and in the standby mode, the bulk voltage VCC_BB generated using the external power voltage VCCE may be applied the internal circuit 140.

Figure 2:
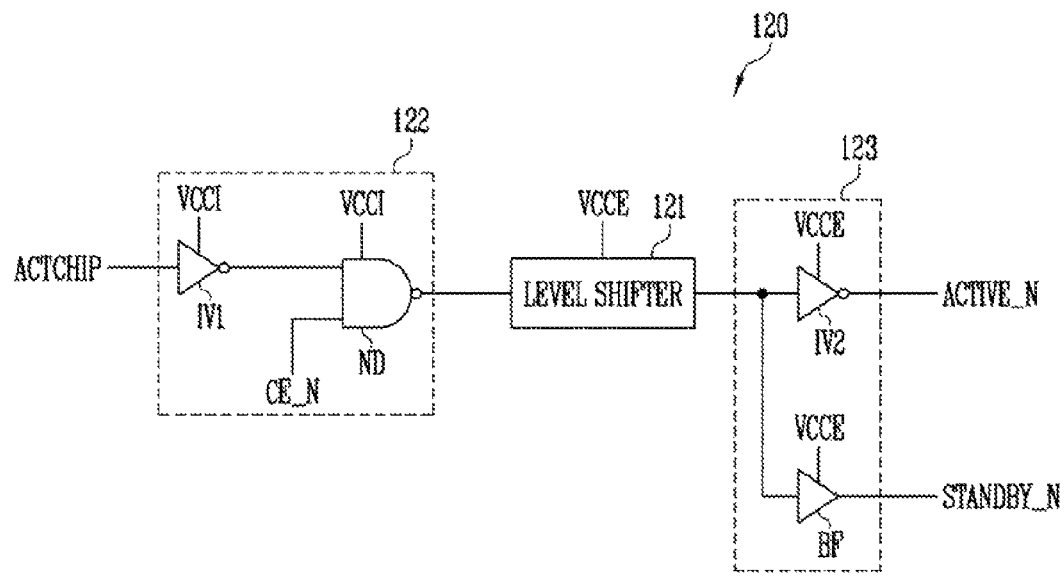
FIG. 2 is a detailed diagram of an operation mode determination circuit shown in FIG. 1.

FIG. 2 is a detailed diagram of the operation mode determination circuit 120 shown in FIG. 1.

Referring to FIG. 2, the operation mode determination circuit 120 may include a logic unit 122, a level shifter 121 and an output unit 123. The logic unit 122 may include an inverter IV1 and a NAND gate ND. The output unit 123 may include an inverter IV2 and a buffer BF.

The inverter IV1 may receive and invert the active chip signal ACTCHIP. The NAND gate ND may perform a NAND combination of an output signal of the inverter IV1 and the chip enable signal CE_N. The inverter IV1 and the NAND gate ND may use the internal power voltage VCCI as a power voltage. Therefore, an output signal of the logic unit 122 may have a logic high level corresponding to the internal power voltage VCCI.

The level shifter 121 may change the logic high level of the output signal of the logic unit 122 from the internal power voltage VCCI to the external power voltage VCCE.

The inverter IV2 may invert the signal output from the level shifter 121 to output the active mode signal ACTIVE_N. The buffer BF may buffer the signal output from the level shifter 121 to output the standby mode signal STANDBY_N. The inverter IV2 and the buffer BF may use the external power voltage VCCE as a power voltage. Therefore, the active mode signal ACTIVE_N and the standby mode signal STANDBY_N have a logic high level corresponding to the external power voltage VCCE.

Figure 3:
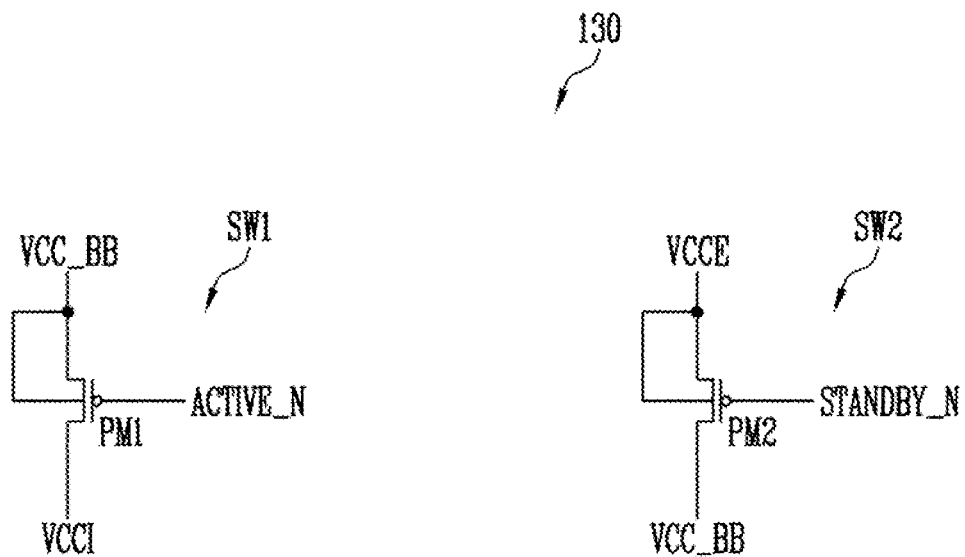
FIG. 3 is a detailed diagram of a bulk voltage generation circuit shown in FIG. 1.

FIG. 3 is a detailed diagram of the bulk voltage generation circuit 130 shown in FIG. 1.

Referring to FIG. 3, the bulk voltage generation circuit 130 may include a first switch unit SW1 and a second switch unit SW2.

The first switch unit SW1 may include a PMOS transistor PM1 connected to the internal power voltage VCCI. The PMOS transistor PM1 may drive the bulk voltage VCC_BB terminal with the internal power voltage VCCI, in response to the active mode signal ACTIVE_N. The bulk voltage VCC_BB may be applied to a bulk of the PMOS transistor PM1.

The second switch unit SW2 may include a PMOS transistor PM2 coupled to the external power voltage VCCE. The PMOS transistor PM2 may drive the bulk voltage VCC_BB terminal with the external power voltage VCCE, in response to the standby mode signal STANDBY_N. The external power voltage VCCE may be applied to a bulk of the PMOS transistor PM2.

By a switching operation of the first switch unit SW1 of the bulk voltage generation circuit 130, the internal power voltage VCCI may be output as the bulk voltage VCC_BB in the active mode. By a switching operation of the second switch unit SW2 of the bulk voltage generation circuit 130, the external power voltage VCCE may be output as the bulk voltage VCC_BB in the standby mode. In the standby mode, the first switch unit SW1 is deactivated, and the bulk voltage VCC_BB having the external power voltage VCCE may be applied to the bulk of the PMOS transistor PM1 to prevent a leakage current path from being established in a direction from the bulk voltage VCC_BB to the internal power voltage VCCI.

Figure 4:
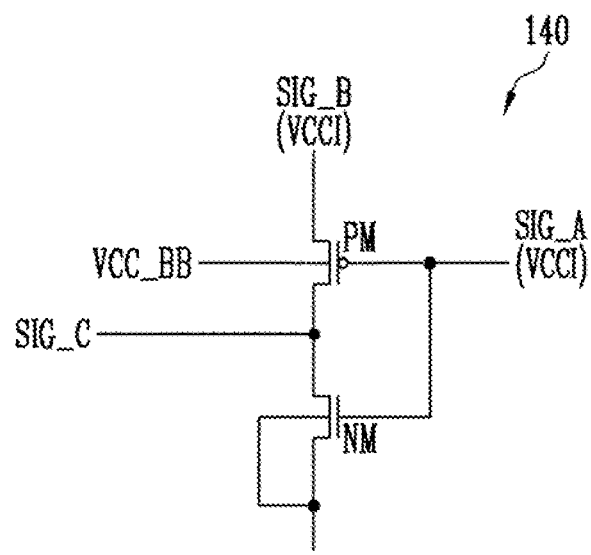
FIG. 4 is a circuit diagram illustrating transistors included in an internal circuit shown in FIG. 1.

FIG. 4 is a circuit diagram of transistors included in the internal circuit 140 shown in FIG. 1.

Referring to FIG. 4, the internal circuit 140 includes a PMOS transistor PM and an NMOS transistor NM.

The PMOS transistor PM and the NMOS transistor NM may be coupled in series.

When the PMOS transistor PM and the NMOS transistor NM are coupled in series, if a signal SIG_B having the internal power voltage VCCI is transferred as signal SIG_C, in response to signal SIG_A having the internal power voltage VCCI, the bulk voltage VCC_BB may be applied to the bulk of the PMOS transistor PM. In the standby mode of the semiconductor memory device 100, since the external power voltage VCCE having a higher voltage than the internal power voltage VCCI may be applied as the bulk voltage VCC_BB, a leakage current path caused by the PMOS transistor PM may be blocked. Therefore, power consumption in the standby mode may be reduced.

Figure 5:
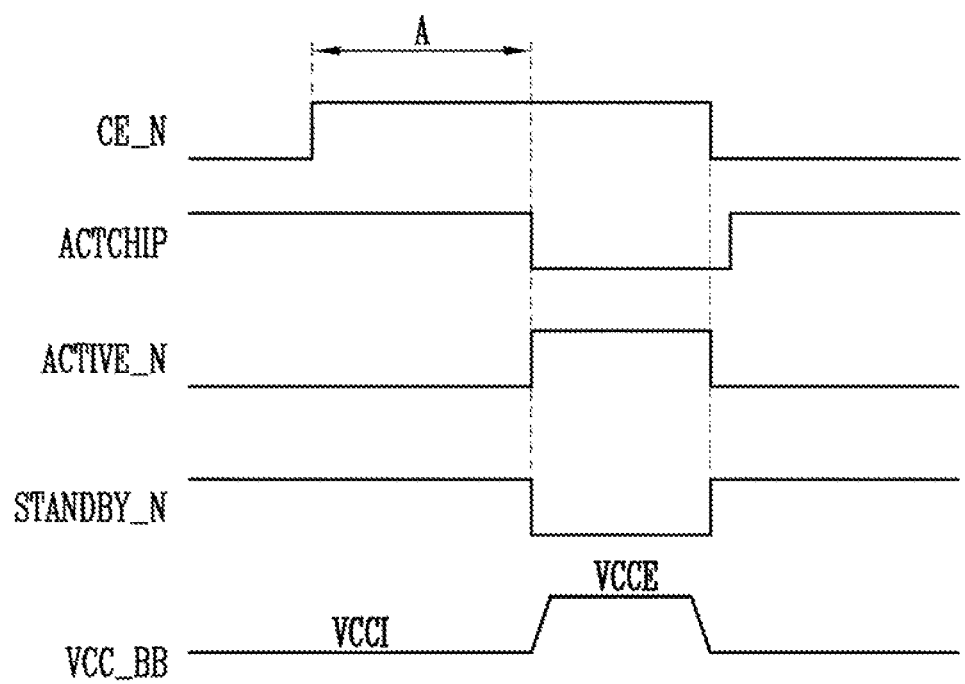
FIG. 5 is a waveform view describing an operation of the semiconductor memory device shown in FIG. 1.

FIG. 5 is a waveform view for describing an operation of the semiconductor memory device 100 shown in FIG. 1.

The operation of the semiconductor memory device 100 is described below with reference to FIGS. 1 to 5.

1) Active Mode

In an active mode of the semiconductor memory device 100, the chip enable signal CE_N may keep a logic low level, so that the control signal generation unit 110 may generate the active chip signal ACTCHIP at a logic high level.

The operation mode determination circuit 120 may activate the active mode signal ACTIVE_N at a logic low level and the standby mode signal STANDBY_N at a logic high level, in response to the chip enable signal CE_N having a logic low level and the active chip signal ACTCHIP having a logic high level.

The bulk voltage generation circuit 130 may switch and output the internal power voltage VCCI to the bulk voltage VCC_BB terminal in response to the active mode signal ACTIVE_N having the logic low level, and the bulk voltage VCC_BB having the internal power voltage VCCI may be applied to the bulk of the PMOS transistor PM included in the internal circuit 140.

2) Standby Mode

When the chip enable signal CE_N is applied at a logic high level for a predetermined time 'A' or longer immediately before the standby mode of the semiconductor memory device 100 is determined, the control signal generation unit 110 may deactivate the active chip signal ACTCHIP at a logic low level.

The operation mode determination circuit 120 may deactivate the active mode signal ACTIVE_N to a logic high level and activate the standby mode signal STANDBY_N to a logic low level, in response to the chip enable signal CE_N having the logic high level and the active chip signal ACTCHIP having the logic low level.

The bulk voltage generation circuit 130 may switch the external power voltage VCCE to the bulk voltage VCC_BB terminal in response to the standby mode signal STANDBY_N having the logic low level, and the bulk voltage VCC_BB having the external power voltage VCCE may be applied to the bulk of the PMOS transistor PM included in the internal circuit 140.

Therefore, the bulk voltage applied to the PMOS transistor PM in the standby mode may be increased, thereby reducing off-leakage current.

Figure 6:
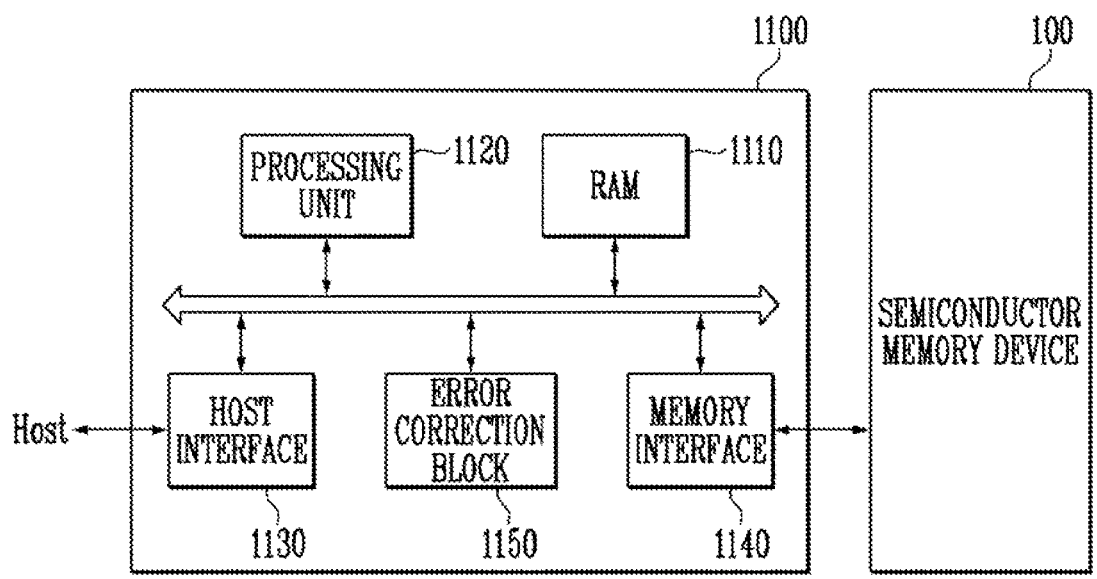
FIG. 6 is a block diagram illustrating a memory system including the semiconductor memory device shown in FIG. 1.

FIG. 6 is a block diagram illustrating a memory system 1000 including the semiconductor memory device 100 shown in FIG. 1.

Referring to FIG. 6, the memory system 1000 may include the semiconductor memory device 100 and a controller 1100.

The semiconductor memory device 100 may be configured and operated in substantially the same manner as described above with reference to FIG. 1. Thus, a detailed description thereof will be omitted.

The controller 1100 may be coupled to a host and the semiconductor memory device 100. The controller 1100 may access the semiconductor memory device 100 at the request of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as operation memory of the processing unit 1120, a cache memory between the semiconductor memory device 100 and the host, and/or a buffer memory between the semiconductor memory device 100 and the host. The processing unit 1120 may control operations of the controller 1100.

The host interface 1130 may include a protocol for exchanging data between the host and the controller 1100. For example, the controller 1100 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor memory device 100. For example, the memory interface may include a NAND flash interface or a NOR flash interface.

The error correction block 1150 may detect and correct errors in data read from the semiconductor memory device 100 by using an error correction code (ECC). The controller 1100 and the semiconductor memory device 100 may be integrated in a single semiconductor device. According to an embodiment of the present invention, the controller 1100 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 7:
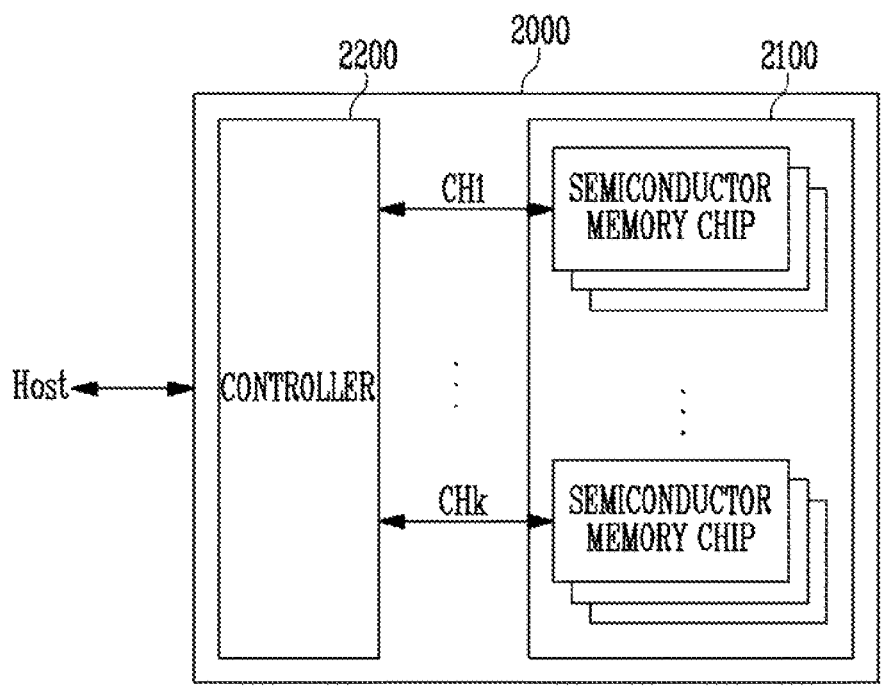
FIG. 7 is a block diagram illustrating an applied example of the memory system shown in FIG. 6.

FIG. 7 is a block diagram illustrating an applied example of the memory system 1000 shown in FIG. 6.

Referring to FIG. 7, a memory system 2000 may include a semiconductor memory device 2100 and a controller 2200. The semiconductor memory device 2100 may include semiconductor memory chips. The semiconductor memory chips may be divided into groups.

FIG. 7 illustrates the groups communicating with the controller 2200 through first to k-th channels CH1 to CHk. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1100 described with reference to FIG. 6, and configured to control the memory chips of the semiconductor memory device 2100.

Figure 8:
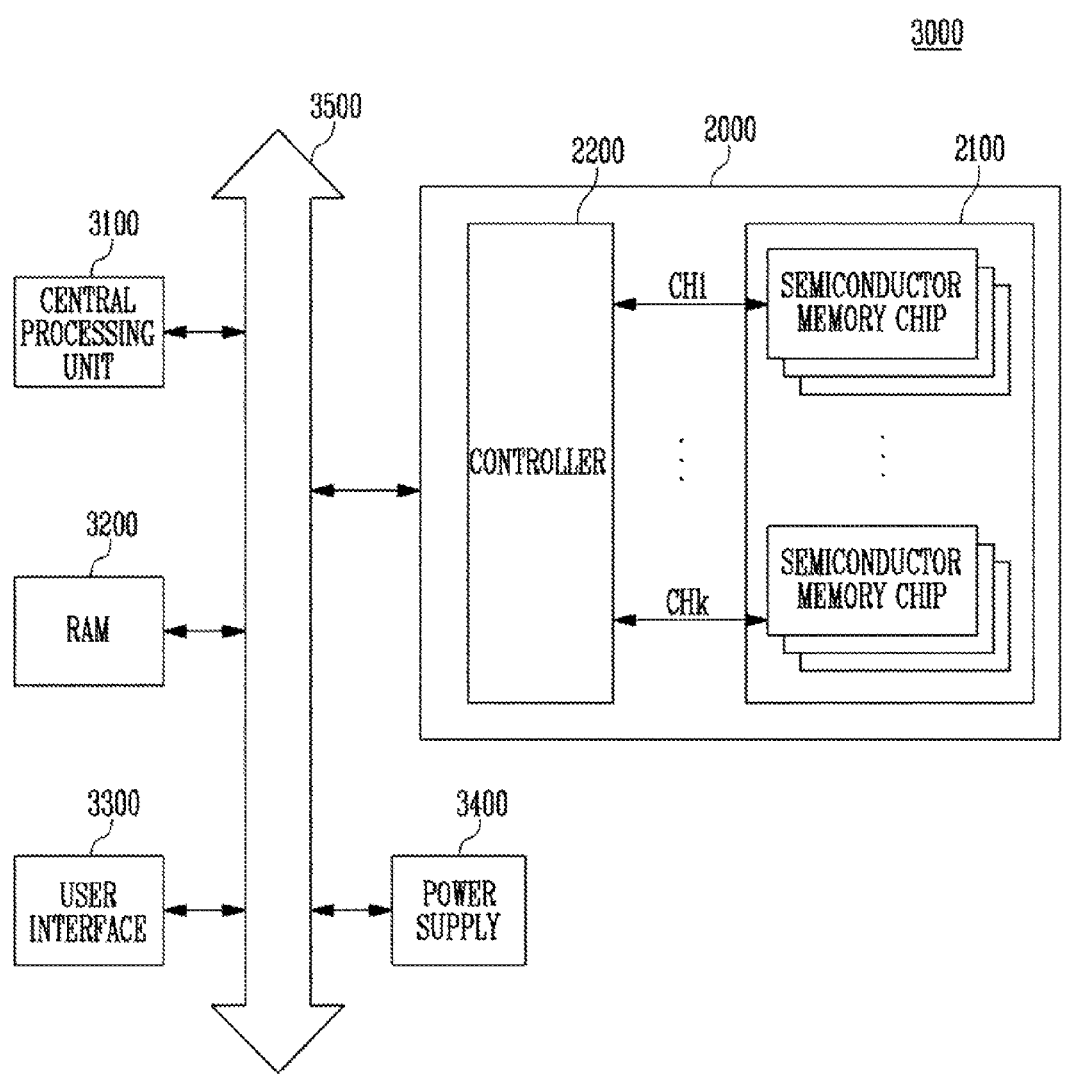
FIG. 8 is a block diagram illustrating a computing system including the memory system shown in FIG. 7.

FIG. 8 is a block diagram illustrating a computing system 3000 having the memory system 2000 shown in FIG. 7.

Referring to FIG. 8, the computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 8, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 8, the memory system 2000 shown in FIG. 7 may be included as the memory system 3000. However, the memory system 2000 may be replaced with the memory system 1000 shown in FIG. 6. According to an embodiment, the computing system 3000 may include both of the memory systems 1000 and 2000 described above with reference to FIGS. 6 and 7.

According to an embodiment, since a bulk bias is generated using an external power higher than an internal power in a standby mode of a semiconductor memory device, a leakage current caused by transistors of the semiconductor memory device may be prevented to reduce consumption of standby current.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A voltage generator, comprising:
    an operation mode determination circuit configured to determine an active mode or a standby mode based on a chip enable signal to activate an active mode signal or a standby mode signal according to a result of the determination; and
    a bulk voltage generation circuit configured to outputting a bulk voltage having an internal power voltage when the active mode signal is activated, and to outputting the bulk voltage having an external power voltage when the standby mode signal is activated, wherein the operation mode determination circuit comprises:
    a logic unit configured to perform a logical combination of the chip enable signal and the active chip signal;
    a level shifter configured to change a logic high level of an output signal of the logic unit from the internal power voltage to the external power voltage; and
    an output unit configured to buffer an output signal of the level shifter to output as the standby mode signal and to invert the output signal of the level shifter to output as the active mode signal
    a control signal generation unit configured to generate an active chip signal, outputted to the operation mode determination circuit, based on the chip enable signal.

2. The voltage generator of claim 1, wherein the control signal generation unit deactivates the active chip signal when the chip enable signal is deactivated for a predetermined time.

3. The voltage generator of claim 1, wherein the logic unit uses the internal power voltage as a power voltage, and the output unit uses the external power voltage as a power voltage.

4. The voltage generator of claim 1, wherein the bulk voltage generation circuit comprises:
    a first switching unit configured to switch the internal power voltage to a bulk voltage terminal in response to the active mode signal; and
    a second switching unit configured to switch the external power voltage to the bulk voltage terminal in response to the standby mode signal.

5. The voltage generator of claim 4, wherein the first switching unit includes a PMOS transistor, and the bulk voltage is applied to a bulk of the PMOS transistor.

6. The voltage generator of claim 4, wherein the second switching unit includes a PMOS transistor, and the external power voltage is applied to a bulk of the PMOS transistor.

7. A semiconductor memory device, comprising:
    a voltage generator configured to generate an internal power voltage as a bulk voltage in an active mode of the semiconductor memory device and to generate an external power voltage as the bulk voltage in a standby mode; and
    an internal circuit configured to include a plurality of transistors being applied with the bulk voltage,
    wherein the voltage generator comprises:
    an operation mode determination circuit configured to determine the active mode or the standby mode based on a chip enable signal to activate an active mode signal or a standby mode signal according to a result of the determination; and
    a bulk voltage generation circuit configured to output the bulk voltage having an internal power voltage when the active mode signal is activated, and to output the bulk voltage having the external power voltage when the standby mode signal is activated, and wherein the operation mode determination circuit comprises:
    a logic unit configured to perform a logical combination of the chip enable signal and the active chip signal;

a level shifter configured to change a logic high level of an output signal of the logic unit from the internal power voltage to the external power voltage;

an output unit configured to buffer an output signal of the level shifter to output as the standby mode signal and to invert the output signal of the level shifter to output as the active mode signal; and a control signal generation unit configured to generate an active chip signal, outputted to the operation mode determination circuit, based on the chip enable signal.

8. The semiconductor memory device of claim 7, wherein the control signal generation unit deactivates the active chip signal when the chip enable signal is deactivated for a predetermined time.

9. The semiconductor memory device of claim 7, wherein the logic unit uses the internal power voltage as a power voltage, and the output unit uses the external power voltage as a power voltage.

10. The semiconductor memory device of claim 7, wherein the bulk voltage generation circuit comprises:

a first switching unit configured to switch the internal power voltage to a bulk voltage terminal in response to the active mode signal; and a second switching unit configured to switch the external power voltage to the bulk voltage terminal in response to the standby mode signal.

11. The semiconductor memory device of claim 10, wherein the first switching unit includes a first PMOS transistor, and the bulk voltage is applied to a bulk of the first PMOS transistor, and the second switching unit includes a second PMOS transistor, and the external power voltage is applied to a bulk of the second PMOS transistor.

* * * * *